(12) United States Patent
Hung et al.

(10) Patent No.: US 8,787,078 B2
(45) Date of Patent: Jul. 22, 2014

(54) METHOD AND APPARATUS FOR REDUCING READ DISTURB IN MEMORY

(71) Applicant: Macronix International Co., Ltd., Hsinchu (TW)

(72) Inventors: Chun Hsiung Hung, Hsinchu (TW); Shuo-Nan Hung, Jhubei (TW); Tseng-Yi Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/105,920

(22) Filed: Dec. 13, 2013

(65) Prior Publication Data

US 2014/0098616 A1    Apr. 10, 2014

Related U.S. Application Data

(63) Continuation of application No. 12/878,299, filed on Sep. 9, 2010, now Pat. No. 8,625,343.

(51) Int. Cl.
*G11C 11/34* (2006.01)
*G11C 16/04* (2006.01)

(52) U.S. Cl.
USPC ............ 365/185.02; 365/185.17; 365/185.18

(58) Field of Classification Search
CPC .... G11C 16/0483; G11C 16/26; G11C 16/28; G11C 16/3427
USPC ........................... 365/185.02, 185.17, 185.18
See application file for complete search history.

(56) References Cited

U.S. PATENT DOCUMENTS

| | | | |
|---|---|---|---|
| 8,169,808 B2 * | 5/2012 | Roohparvar | 365/49.1 |
| 8,625,343 B2 * | 1/2014 | Hung et al. | 365/185.02 |
| 2013/0077404 A1 * | 3/2013 | Nawata et al. | 365/185.17 |

* cited by examiner

*Primary Examiner* — Harry W Byrne
*Assistant Examiner* — Lance Reidlinger
(74) *Attorney, Agent, or Firm* — Kenta Suzue; Haynes Beffel & Wolfeld LLP

(57) ABSTRACT

Various aspects of a NAND memory include a control circuit that applies a read bias arrangement to a plurality of word lines to read a selected data value stored on a plurality of memory cells by measuring current flowing between the first end and the second end of the series of memory cells. The read bias arrangement is applied to word lines of the plurality of word lines applies only word line voltages less than a second maximum of a second threshold voltage distribution.

20 Claims, 11 Drawing Sheets

METHOD AND APPARATUS FOR REDUCING READ DISTURB IN MEMORY

PRIORITY APPLICATIONS

This application is a continuation of U.S. patent application Ser. No. 12/878,299, filed 9 Sep. 2010, now U.S. Pat. No. 8,625,343, entitled Method and Apparatus for Reducing Read Disturb In Memory. This application is incorporated by reference herein.

BACKGROUND

Description of Related Art

Read disturb presents a serious problem to the operation of nonvolatile memory cells such as floating gate and charge trapping memory cells. Read disturb occurs when read operations are performed on nonvolatile memory cells; despite being applied for a read operation rather than a program operation, some programming still occurs while applying a read bias arrangement. Over the course of many read operations, read disturb changes raise the threshold voltage of the affected nonvolatile memory cells.

Read disturb occurs in NAND strings because the read bias arrangement voltage Vpass is sufficiently high to cause programming. In a NAND string of nonvolatile memory cells arranged in series, a read voltage Vread is applied to the word line of a selected memory cell in the NAND string, and a pass voltage Vpass is applied to the word line of unselected memory cell in the NAND string.

FIG. 1 is a graph of threshold voltages distributions, showing the HVt and LVt distributions, the word line read voltage window and the word line pass voltage window. Vpass is sufficiently high to turn on the channel under unselected memory cells in the NAND string regardless of the data values stored on the unselected memory cells. In particular, Vpass is sufficiently high to turn on the channel under a memory cell storing the data value associated with the highest threshold voltage distribution. Vread is sufficiently high to turn on the channel under a selected memory cells in the NAND string with a data value associated with a threshold voltage distribution that is lower than Vread, and is sufficiently low to turn off the channel under a selected memory cells in the NAND string with a data value associated with a threshold voltage distribution that is higher than Vread.

SUMMARY

Various aspects approach the read disturb problem by reducing the Vpass voltage. Typically, the Vpass voltage exceeds the highest threshold voltage distribution, so that regardless of the data values stored on the unselected memory cells of a NAND string, the channel is turned on under unselected memory cells of a NAND string. However, various embodiments reduce the Vpass voltage below the maximum of the highest threshold voltage distribution. Various embodiments accomplish this by storing a single selected data bit per NAND string. Other unselected memory cells in the NAND string that do not store user selected data, store a threshold voltage from a low threshold voltage distribution, so that the reduced Vpass turns on the unselected memory cells of a NAND string.

A first aspect has the reduced Vpass voltage. A second aspect has both the reduced Vpass voltage and an unreduced Vpass voltage, depending on the instructions. A third aspect has both the reduced Vpass voltage and an unreduced Vpass voltage, depending on the instruction register. Various aspects are discussed below.

A first aspect of the technology is a memory with a plurality of memory cells, a plurality of word lines, and control circuitry.

The plurality of memory cells is arranged in series in a semiconductor body. The series has a first end and a second end. Memory cells in the plurality of memory cells have a threshold voltage in one of a first threshold voltage distribution associated with a first data value and a second threshold voltage distribution associated with a second data value. The first threshold voltage distribution has a first minimum and a first maximum. The second threshold voltage distribution has a second minimum and a second maximum. The first threshold voltage distribution is a lower voltage distribution than the second threshold voltage distribution.

Word lines in the plurality of word lines are coupled to corresponding memory cells in the plurality of memory cells.

The control circuit is coupled to the plurality of word lines. The control circuit applies a read bias arrangement to the plurality of word lines to read a selected data value stored on the plurality of memory cells by measuring current flowing between the first end and the second end of the series. The read bias arrangement applied to word lines of the plurality of word lines applies only word line voltages less than the second maximum of the second threshold voltage distribution.

In one embodiment, the read bias arrangement applied by the control circuit to word lines of the plurality of word lines applies only word line voltages greater the first maximum of the first threshold voltage distribution.

In one embodiment, the control circuit stores a same selected data value in all memory cells in the plurality of memory cells.

In one embodiment, the memory cells include a programmed memory cell having the second threshold voltage distribution.

Other embodiments store a single bit per NAND string differently.

In one embodiment the plurality of memory cells includes:
(i) at least one selected memory cell in the plurality of memory cells. The control circuit stores a same selected data value in all of said at least one selected memory cell.
(ii) other memory cells different from said at least one selected memory cell. These other memory cells store the first data value. The first threshold voltage distribution associated with the first data value is a lower voltage distribution than the second threshold voltage distribution associated with the second data value.

Responsive to the control circuit applying the read bias arrangement to the plurality of word lines, the same selected data value is read from the plurality of memory cells.

In one embodiment, the preceding storage is performed by the control circuit responsive to a program instruction.

A second aspect of the technology is a memory with a plurality of memory cells, a plurality of word lines, and control circuitry.

The control circuit has multiple sets of instructions, including a first set of instructions and a second set of instructions.

The first set of instructions includes a first read instruction that applies a first read bias arrangement to the plurality of word lines to read a selected data value stored on the plurality of memory cells by measuring current flowing between the first end and the second end of the series. The first read bias arrangement applied to word lines of the plurality of word lines applies both (i) word line voltages greater than the first maximum of the first threshold voltage distribution and less than the second minimum of the second threshold voltage distribution, and (ii) word line voltages greater than the second maximum of the second threshold voltage distribution.

The second set of instructions includes a second read instruction that applies the read bias arrangement to the plurality of word lines to read a selected data value stored on the plurality of memory cells by measuring current flowing between the first end and the second end of the series. The read bias arrangement applied to word lines of the plurality of word lines applies only word line voltages and less than the second maximum of the second threshold voltage distribution.

In one embodiment, the first set of instructions corresponds to memory cells in the plurality of memory cells having the threshold voltage in one of at least four threshold voltage distributions associated with different data values, including at least the first threshold voltage distribution associated with the first data value, the second threshold voltage distribution associated with the second data value, a third threshold voltage distribution associated with a third data value, and a fourth threshold voltage distribution associated with a fourth data value.

the second set of instructions corresponds to memory cells in the plurality of memory cells having the threshold voltage in one of only two threshold voltage distributions associated with different data values, including the first threshold voltage distribution associated with the first data value and the second threshold voltage distribution associated with the second data value.

Another embodiment includes read and program instructions for the different sets of instructions.

In one embodiment, corresponding to the second set of instructions, the control circuit stores a same selected data value in all memory cells in the plurality of memory cells.

In one embodiment, the second set of instructions includes a program instruction that stores a same selected data value in all memory cells in the plurality of memory cells.

Other embodiments store a single bit per NAND string differently.

In one embodiment, corresponding to the second set of instructions, the plurality of memory cells includes:
(i) at least one selected memory cell in the plurality of memory cells. The control circuit stores a same selected data value in all of said at least one selected memory cell.
(ii) other memory cells different from said at least one selected memory cell. These other memory cells store the first data value. The first threshold voltage distribution associated with the first data value is a lower voltage distribution than the second threshold voltage distribution associated with the second data value.

Responsive to the control circuit applying the read bias arrangement to the plurality of word lines, the same selected data value is read from the plurality of memory cells.

In one embodiment, the preceding storage is performed by the control circuit responsive to a program instruction.

In one embodiment the first set of instructions corresponds to a first version of the second threshold voltage distribution associated with the second data value. The first version of the second threshold voltage distribution has a first version distribution minimum.

The second set of instructions corresponds to a second version of the second threshold voltage distribution associated with the second data value. The second version of the second threshold voltage distribution has a second version distribution minimum.

The first version distribution minimum is smaller than the second version distribution minimum.

A third aspect of the technology is a memory with a plurality of memory cells, a plurality of word lines, an instruction register, and control circuitry.

The instruction register stores one of a first value and a second value.

The control circuit is responsive to the value stored in the instruction register.

Responsive to the instruction register storing the first value, the read instruction applies a first read bias arrangement to the plurality of word lines to read a selected data value stored on the plurality of memory cells by measuring current flowing between the first end and the second end of the series. The first read bias arrangement applied to word lines of the plurality of word lines applies both (i) word line voltages less than the second minimum of the second threshold voltage distribution, and (ii) word line voltages greater than the second maximum of the second threshold voltage distribution.

Responsive to the instruction register storing the second value, the read instruction applies the read bias arrangement to the plurality of word lines to read a selected data value stored on the plurality of memory cells by measuring current flowing between the first end and the second end of the series. The read bias arrangement applied to word lines of the plurality of word lines applies only word line voltages greater than the first maximum of the first threshold voltage distribution and less than the second maximum of the second threshold voltage distribution.

In one embodiment, the instruction register storing the first value, corresponds to memory cells in the plurality of memory cells having the threshold voltage in one of at least four threshold voltage distributions associated with different data values, including at least the first threshold voltage distribution associated with the first data value, the second threshold voltage distribution associated with the second data value, a third threshold voltage distribution associated with a third data value, and a fourth threshold voltage distribution associated with a fourth data value.

The instruction register storing the second value, corresponds to memory cells in the plurality of memory cells having the threshold voltage in one of only two threshold voltage distributions associated with different data values, including the first threshold voltage distribution associated with the first data value and the second threshold voltage distribution associated with the second data value.

In one embodiment, corresponding to the instruction register storing the second value, the control circuit stores a same selected data value in all memory cells in the plurality of memory cells.

In one embodiment, corresponding to the instruction register storing the second value, the control circuit includes a program instruction that stores a same selected data value in all memory cells in the plurality of memory cells.

Other embodiments store a single bit per NAND string differently.

In one embodiment, corresponding to the instruction register storing the second value, the plurality of memory cells includes:
(i) at least one selected memory cell in the plurality of memory cells. The control circuit stores a same selected data value in all of said at least one selected memory cell.
(ii) other memory cells different from said at least one selected memory cell. These other memory cells store the first data value, and the first threshold voltage distribution associated with the first data value is a lower voltage distribution than the second threshold voltage distribution associated with the second data value.

Responsive to the control circuit applying the read bias arrangement to the plurality of word lines, the same selected data value is read from the plurality of memory cells.

In one embodiment, the preceding storage is performed by the control circuit responsive to a program instruction.

In one embodiment, the instruction register storing the first value corresponds to a first version of the second threshold voltage distribution associated with the second data value. The first version of the second threshold voltage distribution has having a first version distribution minimum.

The instruction register storing the second value corresponds to a second version of the second threshold voltage distribution associated with the second data value. The second version of the second threshold voltage distribution has a second version distribution minimum.

The first version distribution minimum is smaller than the second version distribution minimum.

Another aspect is a method of using pluralities of memory cells arranged in series in a semiconductor body. The series has a first end and a second end. Memory cells in the plurality of memory cells have a threshold voltage in one of a first threshold voltage distribution associated with a first data value and a second threshold voltage distribution associated with a second data value. The first threshold voltage distribution is a lower voltage distribution than the second threshold voltage distribution. The first threshold voltage distribution has a first minimum and a first maximum and the second threshold voltage distribution has a second minimum and a second maximum. The method comprises:

applying a read bias arrangement to a plurality of word lines to read a selected data value stored on the plurality of memory cells by measuring current flowing between the first end and the second end of the series, wherein the read bias arrangement applied to word lines of the plurality of word lines applies only word line voltages less than the second maximum of the second threshold voltage distribution.

DETAILED DESCRIPTION

Figure 1:
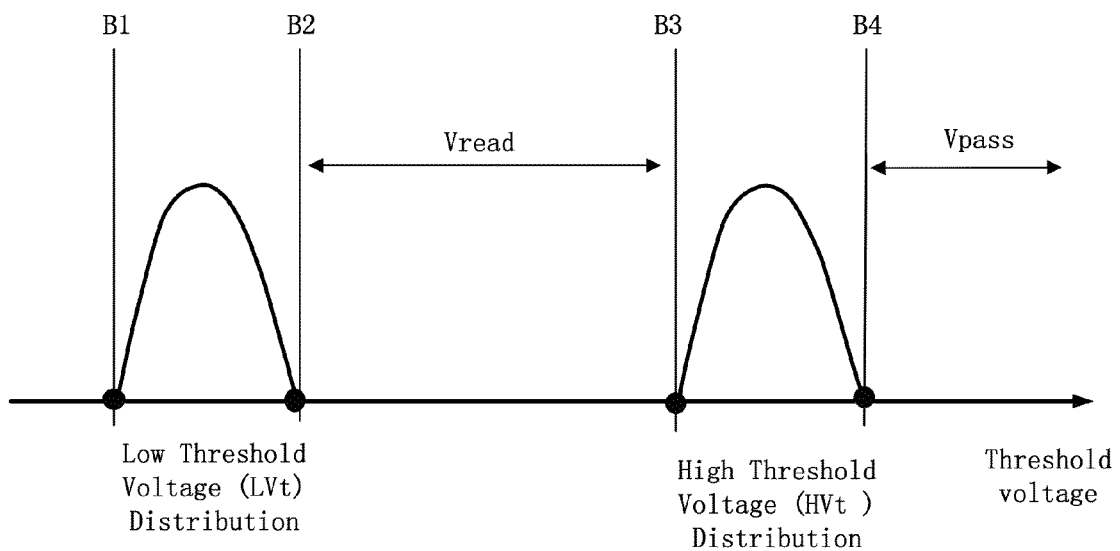
FIG. 1 is a graph of threshold voltages distributions, showing the HVt and LVt distributions, the word line read voltage window and the word line pass voltage window.
Figure 2:
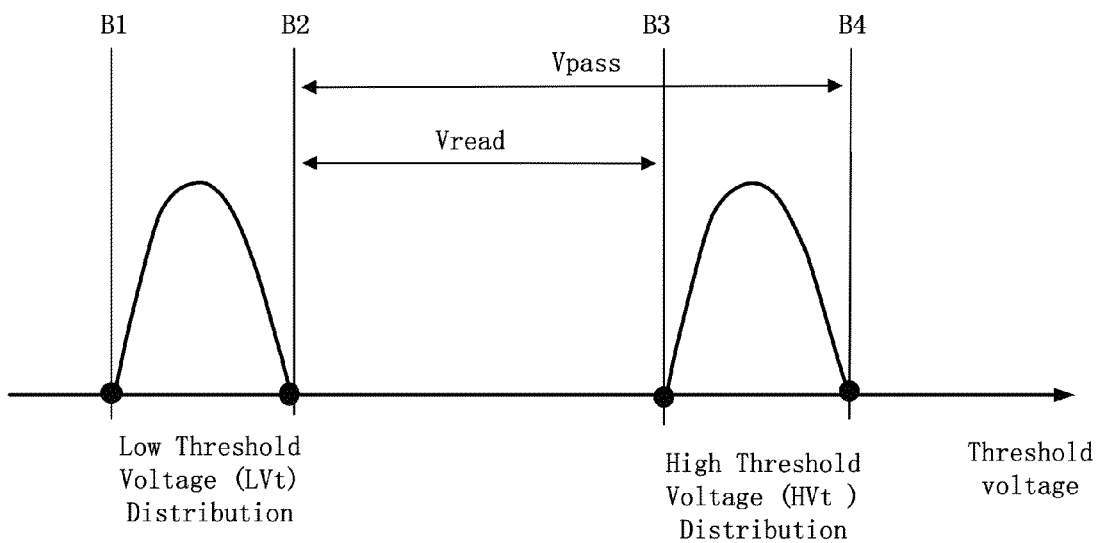
FIG. 2 is a graph of threshold voltages distributions, showing the HVt and LVt distributions, the word line read voltage window and the modified word line pass voltage window.

FIG. 2 is a graph of threshold voltages distributions, showing the HVt and LVt distributions, the word line read voltage window and the modified word line pass voltage window.

The Vpass window is no longer sufficiently high to turn on the channel under unselected memory cells in the NAND string regardless of the data values stored on the unselected memory cells, because the Vpass window does not extend past the maximum of the HVt distribution. However, Vpass is assured to be sufficiently high to turn on the channel under a memory cell storing the data value associated with LVt, the low threshold voltage distribution. Vread is sufficiently high to turn on the channel under a selected memory cells in the NAND string with a data value associated with a threshold voltage distribution that is lower than Vread (such as LVt), and is sufficiently low to turn off the channel under a selected memory cells in the NAND string with a data value associated with a threshold voltage distribution that is higher than Vread (such as HVt).

The read disturb problem is addressed, because the Vpass voltage is reduced. If multiple bits were stored in the NAND string, then the reduced Vpass voltage could present a problem, because the unselected memory cells in the NAND string might not have the channel underneath turned on.

However, embodiments store a single data bit per NAND string. Other unselected memory cells in the NAND string that do not store user selected data, store a threshold voltage from a low threshold voltage distribution, so that the reduced Vpass turns on the unselected memory cells of a NAND string.

Figure 3:
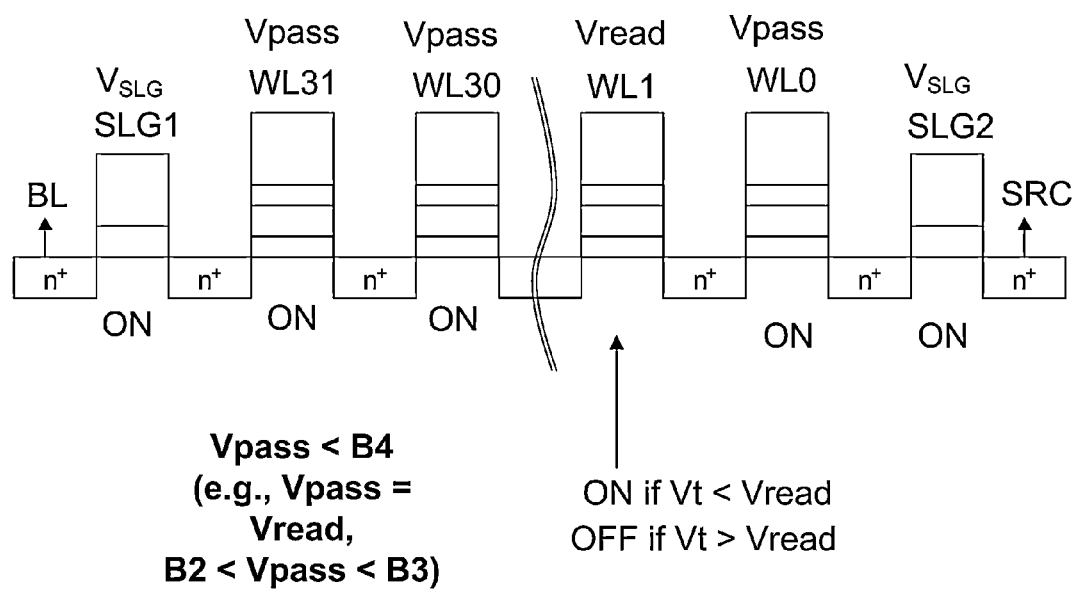
FIG. 3 is a diagram of a NAND string of nonvolatile memory cells, applying the modified word line pass voltage.

FIG. 3 is a diagram of a NAND string of nonvolatile memory cells, applying the modified word line pass voltage.

The NAND string between the bit line BL and the source line SRC has a series of nonvolatile memory cells between pass transistors. A diffusion region is between adjacent transistor/memory cell structures. Alternatively, the diffusion region can be removed, and replaced with an inversion region by adding a gate structure which applies an appropriate voltage.

Vread is applied to the word line of the memory cell selected for reading. Vpass is applied to the other word lines of the memory cells not selected for reading. Typically, Vpass is applied to turn on the underlying channel regardless of the particular data value and its associated threshold voltage distribution that is stored, and Vpass is accordingly set to be high enough to turn on the underlying channel in case a data value associated with a high threshold voltage distribution is stored. However, because embodiments store one data bit per string, Vpass for unselected memory cells does not need to be so high. $V_{SLG}$ is applied to the end select gates SLG1 and SLG2.

Figure 4:
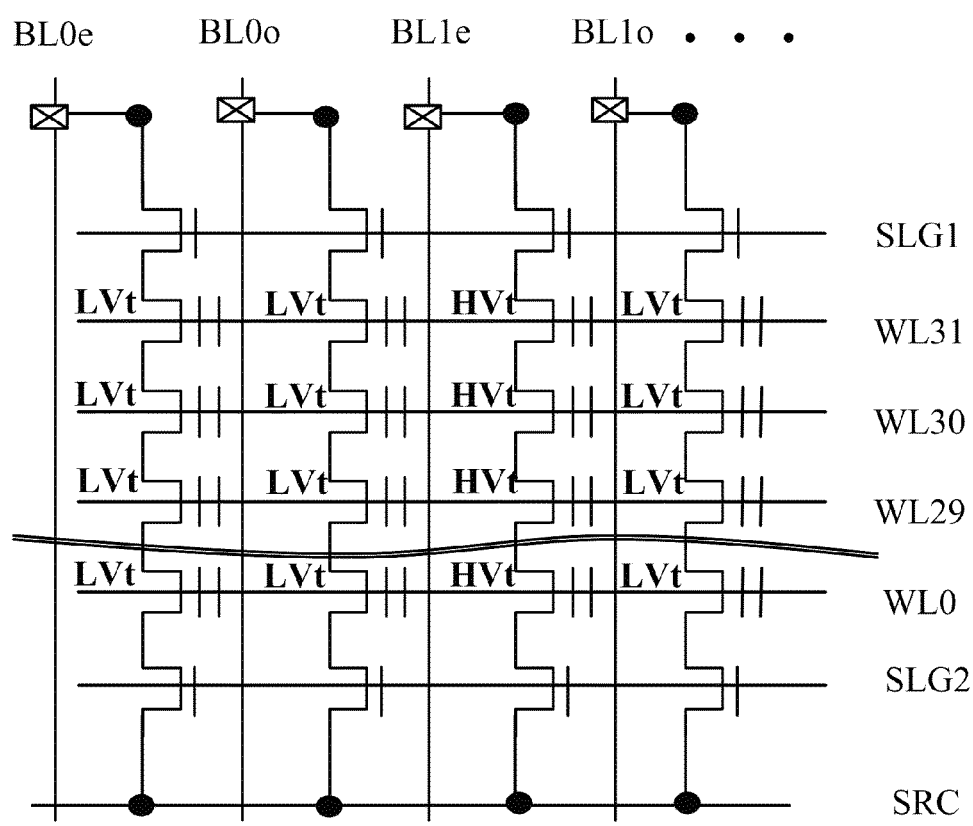
FIG. 4 is a diagram of a NAND array of nonvolatile memory cells, storing a single data bit per NAND string.

FIG. 4 is a diagram of a NAND array of nonvolatile memory cells, storing a single data bit per NAND string.

In the shown data strings, all the threshold voltage distributions are either high HVt or low LVt. In either case, the reduced Vpass is used. In the event that Vpass is used with a memory string that stores HVt, the Vpass voltage may not be sufficient to turn on the underlying channel. However, this is not a problem, because the underlying channel of the memory cell having the gate which receives Vread will not be turned on either, anyway.

In one embodiment, the shown data storage pattern is performed with dedicated program and read instructions.

In another embodiment, the shown data storage pattern is performed with multiple normal program and read instructions.

Figure 5:
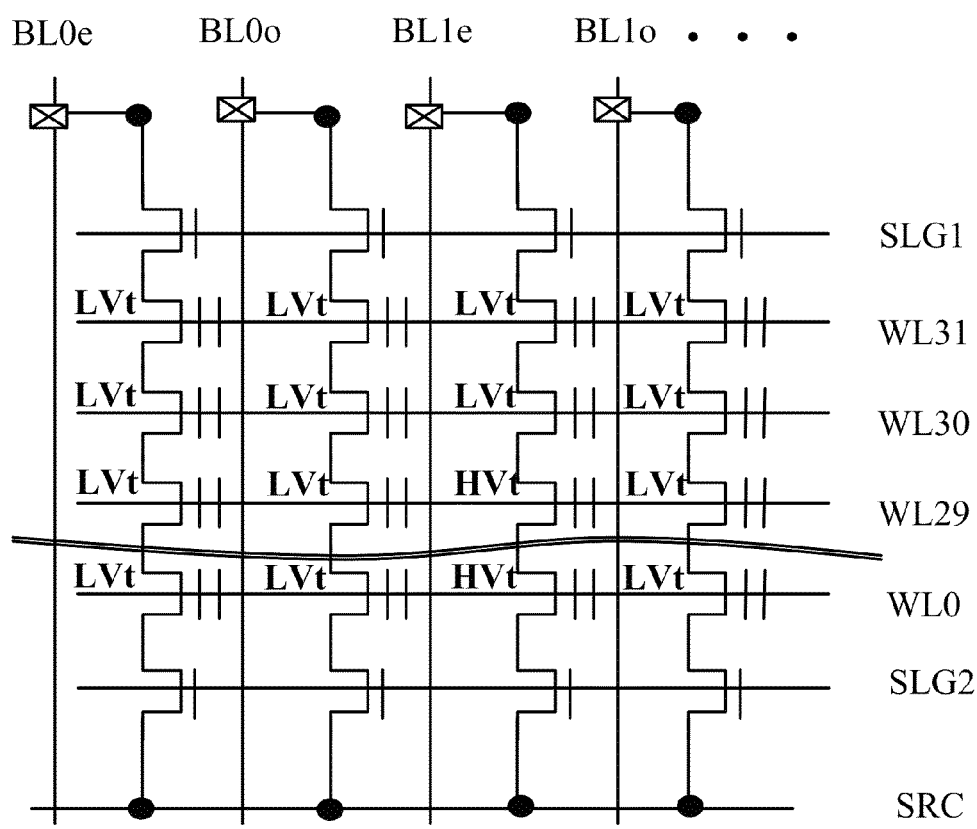
FIG. 5 is another diagram of a NAND array of nonvolatile memory cells, storing a single data bit per NAND string.

FIG. 5 is another diagram of a NAND array of nonvolatile memory cells, storing a single data bit per NAND string.

In the shown data strings, all the threshold voltage distributions are not either high HVt or low LVt. Instead, the default distribution is LVt, and some subset of one or more memory cells stores either either high HVt or low LVt. This subset stores a same data bit. The memory cells in the subset can be on either end of the NAND string, in the middle of the NAND string, be adjacent memory cells, or nonadjacent memory cells.

In the shown case, the memory string of bit line BL1e has multiple memory cells under at least WL0 and WL29 with HVt. Vread is applied to at least either WL0 or WL29 to read the stored data bit of the memory string of bit line BL1e.

In the event that Vpass is used with memory cells in the subset of the memory string that stores HVt, the Vpass voltage may not be sufficient to turn on the underlying channel. However, this is not a problem, because the underlying channel of the memory cell in the subset having the gate which receives Vread will not be turned on either, anyway.

In one embodiment, the shown data storage pattern is performed with dedicated program and read instructions.

In another embodiment, the shown data storage pattern is performed with multiple normal program and read instructions.

Figure 6:
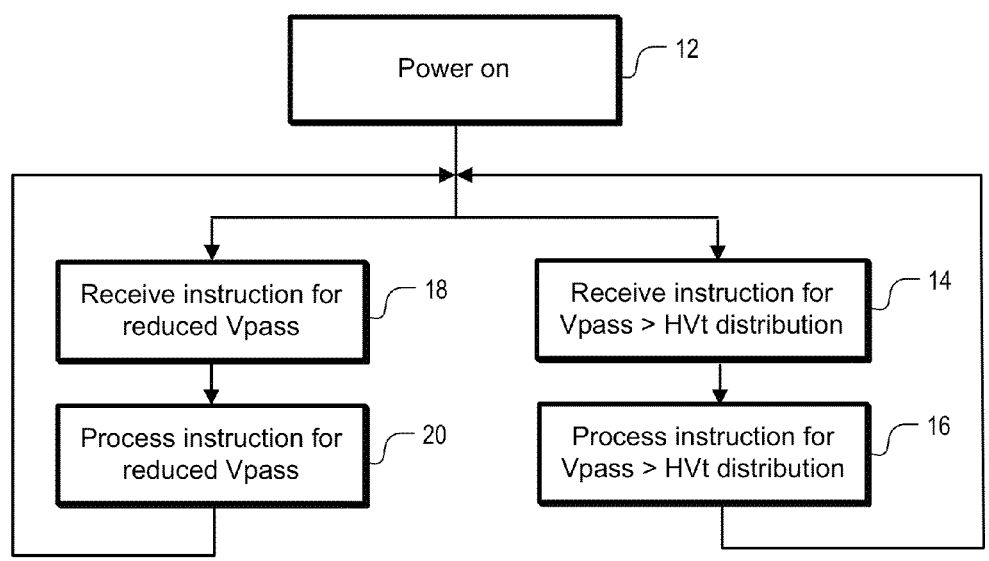
FIG. 6 is a flowchart of the different instructions for typical word line pass voltage and modified word line pass voltage.

FIG. 6 is a flowchart of the different instructions for typical word line pass voltage and modified word line pass voltage.

In 12, power on occurs. In 14, an instruction is received with an instruction code for a typical Vpass voltage that is greater than the maximum of the highest threshold voltage distribution, typically along with the address of the memory cell. In 16, the instruction is processed. The instruction may be read or program.

In 18, an instruction is received with an instruction code for a reduced Vpass voltage that is less than the maximum of the highest threshold voltage distribution, typically along with the address of the memory cell. In 20, the instruction is processed. The instruction may be read or program.

Figure 7:
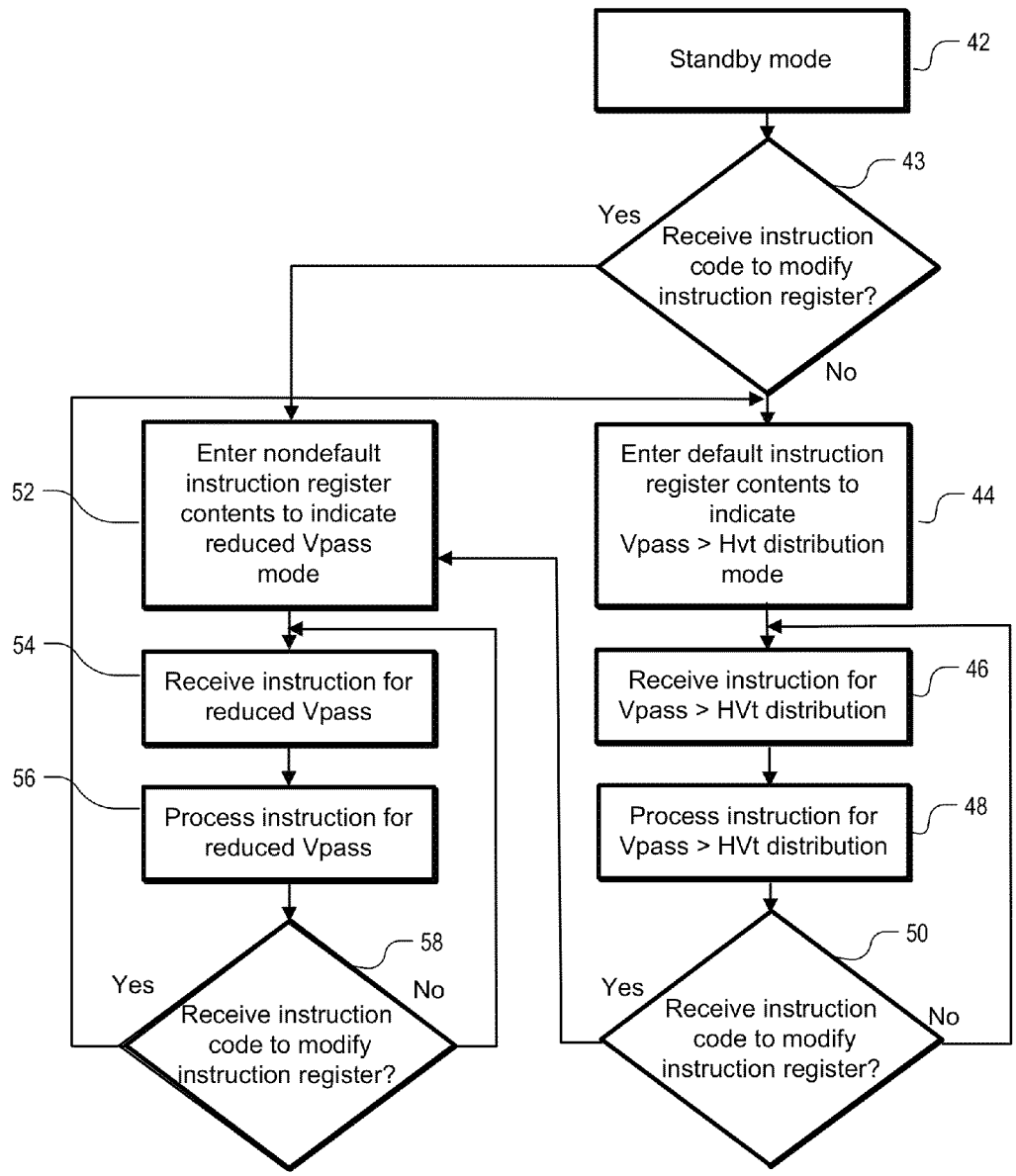
FIG. 7 is a flowchart of the different instruction register values for typical word line pass voltage and modified word line pass voltage.

FIG. 7 is a flowchart of the different instruction register values for typical word line pass voltage and modified word line pass voltage.

In 42, standby mode occurs. In 43, if an instruction code is not received to modify the instruction register contents, the process continues to 44. Otherwise, the process continues with 52.

In 44, default instruction register contents are entered to indicate that the control circuitry is in the mode of using a typical Vpass voltage that is greater than the maximum of the highest threshold voltage distribution, typically along with the address of the memory cell. In 46, an instruction is received with an instruction code for a typical Vpass voltage that is greater than the maximum of the highest threshold voltage distribution, typically along with the address of the memory cell. In 48, the instruction is processed. The instruction may be read or program.

In 50, if an instruction code is not received to modify the instruction register contents, the process returns to 46. Otherwise, the process continues with 52.

In 52, nondefault instruction register contents are entered to indicate that the control circuitry is in the mode of using a reduced Vpass voltage that is less than the maximum of the highest threshold voltage distribution, typically along with the address of the memory cell. In 54, an instruction is received with an instruction code for a reduced Vpass voltage that is less than the maximum of the highest threshold voltage distribution, typically along with the address of the memory cell. In 56, the instruction is processed. The instruction may be read or program.

In 58, if an instruction code is not received to modify the instruction register contents, the process returns to 54. Otherwise, the process continues with 44.

Figure 8:
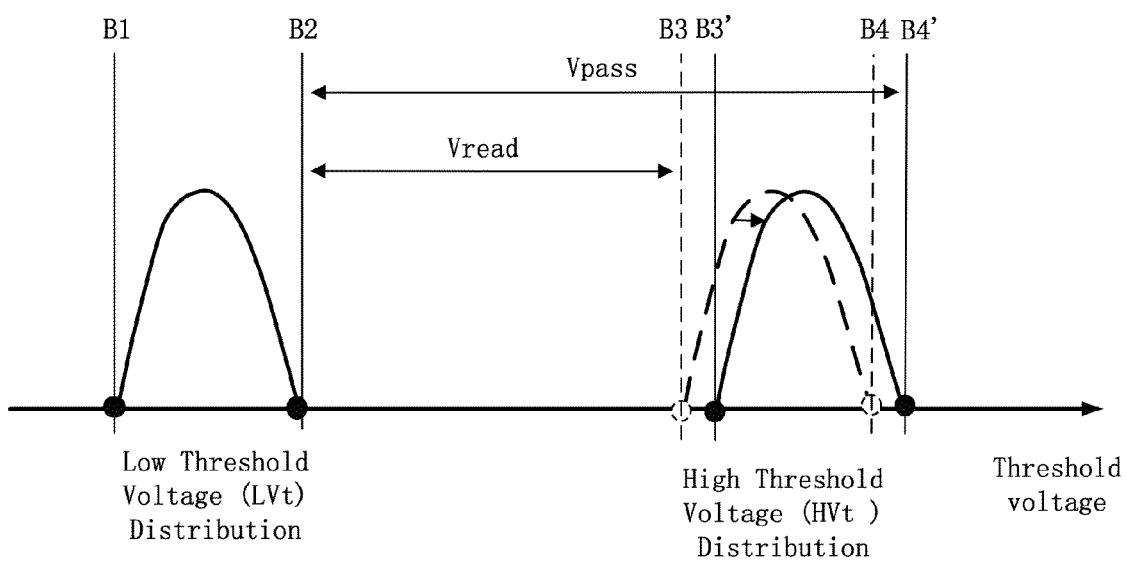
FIG. 8 is a graph of threshold voltages distributions, showing the adjusted HVt distribution, along with the LVt distribution, the word line read voltage window and the modified word line pass voltage window.

FIG. 8 is a graph of threshold voltages distributions, showing the adjusted HVt distribution, along with the LVt distribution, the word line read voltage window and the modified word line pass voltage window.

Because embodiments use a reduced Vpass voltage that is less than the maximum of the highest threshold voltage distribution anyway, an increased HVt distribution will not cause read disturb problems. Despite the upward shift in the HVt distribution, the Vpass will not also increase, thereby keeping the advantages of an increased HVt distribution without the disadvantage of worsened read disturb.

In embodiments with different read and program modes that selectively use the normal Vpass or the reduced Vpass, the upward shifted HVt is used with the reduced Vpass NAND strings, and the normal HVt is used with the normal Vpass NAND strings.

Figure 9:
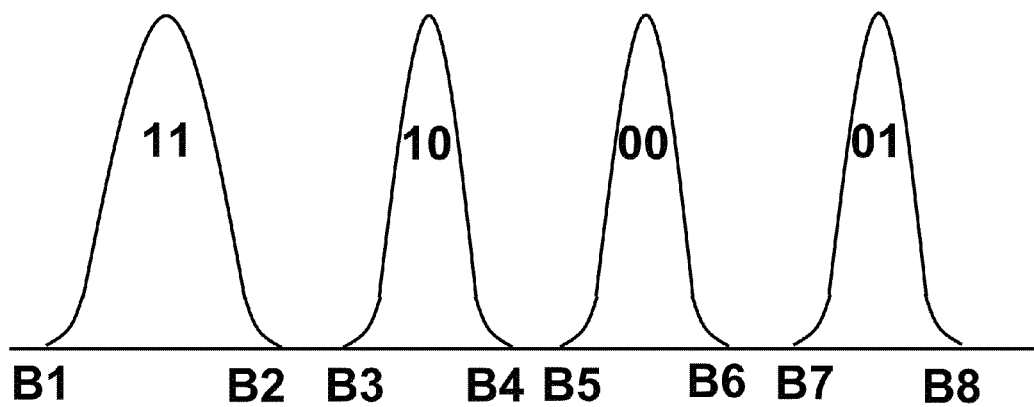
FIG. 9 is a graph of threshold voltages distributions, showing the adjusted number of distributions, depending on the instructions or instruction register value.
Figure 9:
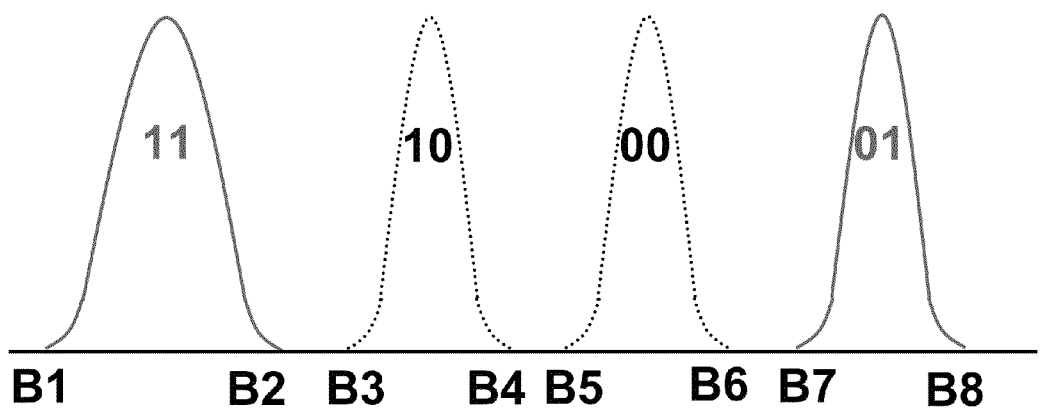

FIG. 9 is a graph of threshold voltages distributions, showing the adjusted number of distributions, depending on the instructions or instruction register value.

In embodiments with different read and program modes that selectively use the normal Vpass or the reduced Vpass, the two level distribution is used with the reduced Vpass NAND strings, and the multilevel cell (MLC) distribution is used with the normal Vpass NAND strings.

Figure 10:
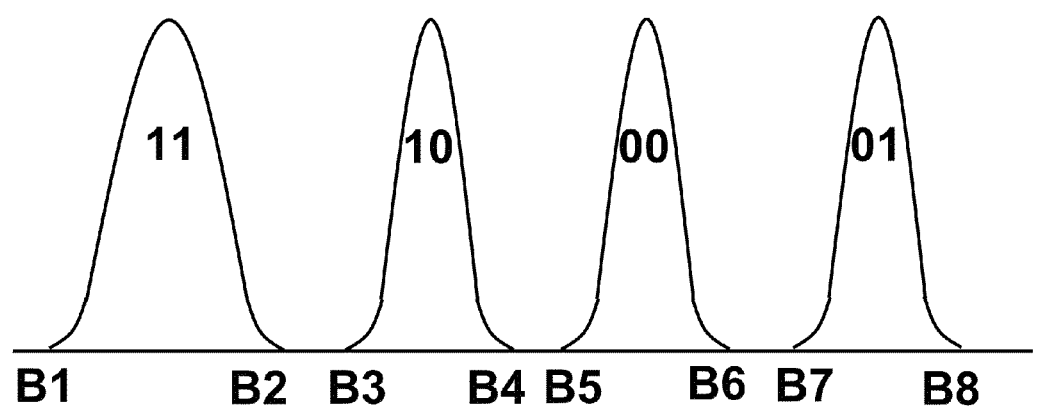
FIG. 10 is a graph of threshold voltages distributions, showing the adjusted number of distributions, depending on the instructions or instruction register value, and the adjusted HVt distribution.
Figure 10:
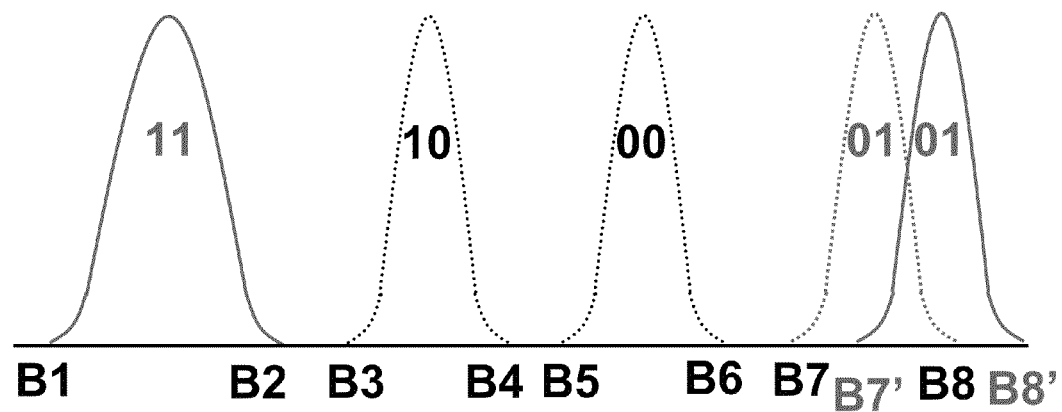

FIG. 10 is a graph of threshold voltages distributions, showing the adjusted number of distributions, depending on the instructions or instruction register value, and the adjusted HVt distribution.

In embodiments with different read and program modes that selectively use the normal Vpass or the reduced Vpass, the two level distribution is used with the reduced Vpass NAND strings, and the multilevel cell (MLC) distribution is used with the normal Vpass NAND strings. The two level distribution uses an upwardly shifted HVt distribution as shown in FIG. 8.

Figure 11:
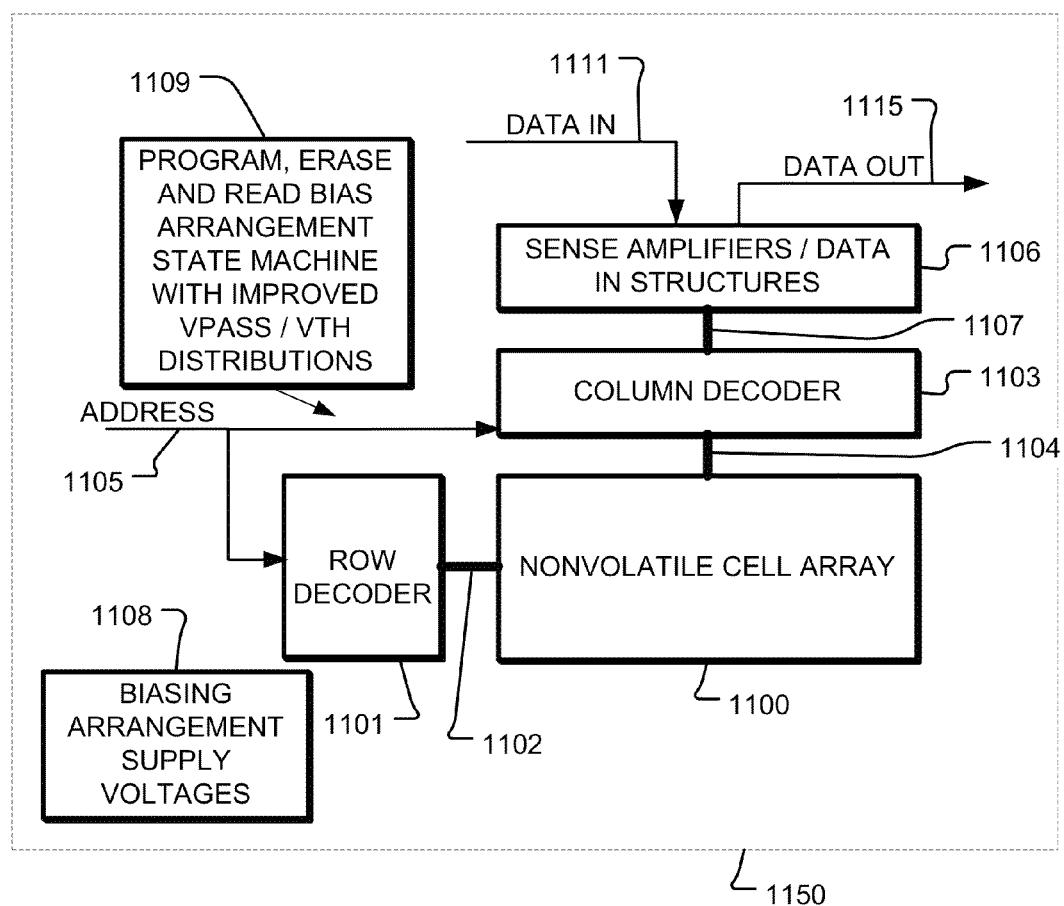
FIG. 11 is a block diagram of a memory integrated circuit with the improvements described herein.

FIG. 11 is a block diagram of a memory integrated circuit with the improvements described herein.

FIG. 11 is a simplified block diagram of an integrated circuit 1150 including a memory array 1100. A word line (or row) and block select decoder 1101 is coupled to, and in electrical communication with, a plurality 1102 of word lines and string select lines, and arranged along rows in the memory array 1100. A bit line (column) decoder and drivers 1103 are coupled to and in electrical communication with a plurality of bit lines 1104 arranged along columns in the memory array 1100 for reading data from, and writing data to, the memory cells in the memory array 1100. Addresses are supplied on bus 1105 to the word line decoder and drivers 1101 and to the bit line decoder 1103. Sense amplifiers and data-in structures in block 1106, including current sources for the read, program and erase modes, are coupled to the bit line decoder 1103 via the bus 1107. Data is supplied via the data-in line 1111 from input/output ports on the integrated circuit 1150, to the data-in structures in block 1106. Data is supplied via the data-out line 1115 from the sense amplifiers in block 1106 to input/output ports on the integrated circuit 1150, or to other data destinations internal or external to the integrated circuit 1150. Program, erase, and read bias arrangement state machine circuitry 1109 implements the improved Vpass voltage and Vth distributions and multimode operation (with reduced Vpass or with unreduced Vpass), and controls biasing arrangement supply voltages 1108. Alternative embodiments include different instruction codes or an instruction register.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory, comprising:
   a plurality of memory cells arranged in series in a semiconductor body, the series having a first end and a second end, the plurality of memory cells having a threshold voltage in one of a first threshold voltage distribution associated with a first data value and a second threshold voltage distribution associated with a second data value, the first threshold voltage distribution having a first minimum and a first maximum and the second threshold voltage distribution having a second minimum and a second maximum, the first threshold voltage distribution being a lower voltage distribution than the second threshold voltage distribution, the plurality of memory cells including:
      a first set of two or more memory cells, memory cells in the first set of two or more memory cells, the threshold voltages in the first set of two or more memory cells representing copies of a same data value;
      a second set of two or more memory cells having the threshold voltage in a default threshold voltage distribution;
   a plurality of word lines, word lines in the plurality of word lines coupled to corresponding memory cells in the plurality of memory cells; and
   a control circuit coupled to the plurality of word lines, wherein the control circuit applies a read bias arrangement to the plurality of word lines to read a selected data value stored on the plurality of memory cells by measuring current flowing between the first end and the second end of the series, wherein the read bias arrangement applied to word lines of the plurality of word lines applies only word line voltages less than the second maximum of the second threshold voltage distribution.

2. The memory of claim 1, wherein the control circuit stores a same selected data value in all memory cells in the first set of two or more memory cells.

3. The memory of claim 1, wherein
   the first set of memory cells includes:
      at least one selected memory cell in the first set of memory cells, wherein the control circuit stores a same selected data value in all of said at least one selected memory cell; and
      other memory cells different from said at least one selected memory cell, wherein said other memory cells store the first data value, and the first threshold voltage distribution associated with the first data value is a lower voltage distribution than the second threshold voltage distribution associated with the second data value,
      such that responsive to the control circuit applying the first read bias arrangement to the first set of word lines, the same selected data value is read from the first set of memory cells.

4. The memory of claim 1, wherein
   the first set of two or more memory cells includes:
      a programmed memory cell having the second threshold voltage distribution.

5. The memory of claim 1, wherein the control circuit has multiple sets of instructions, including:
   a first set of instructions including a first read instruction that applies a first read bias arrangement to the first set of two or more word lines to read a selected data value stored on the first set of two or more memory cells by measuring current flowing between the first end and the second end of the series, wherein the first read bias arrangement applied to word lines of the first set of two or more word lines applies both (i) word line voltages less than the second minimum of the second threshold voltage distribution, and (ii) word line voltages greater than the second maximum of the second threshold voltage distribution; and
   a second set of instructions including a second read instruction that applies the read bias arrangement to the first set of two or more word lines to read a selected data value stored on the first set of two or more memory cells by measuring current flowing between the first end and the second end of the series, wherein the read bias arrangement applied to word lines of the first set of two or more word lines applies only word line voltages less than the second maximum of the second threshold voltage distribution.

6. The memory of claim 5, wherein the first set of instructions corresponds to memory cells in the first set of two or more memory cells having the threshold voltage in one of at least four threshold voltage distributions associated with different data values, including at least the first threshold voltage distribution associated with the first data value, the second threshold voltage distribution associated with the second data value, a third threshold voltage distribution associated with a third data value, and a fourth threshold voltage distribution associated with a fourth data value, and
   wherein the second set of instructions corresponds to memory cells in the first set of two or more memory cells having the threshold voltage in one of only two threshold voltage distributions associated with different data values, including the first threshold voltage distribution associated with the first data value and the second threshold voltage distribution associated with the second data value.

7. The memory of claim 5, wherein the first set of instructions includes the first read instruction and a first program instruction, and the first set of instructions corresponds to memory cells in the first set of two or more memory cells having the threshold voltage in one of at least four threshold voltage distributions associated with different data values, including at least the first threshold voltage distribution associated with the first data value, the second threshold voltage distribution associated with the second data value, a third threshold voltage distribution associated with a third data value, and a fourth threshold voltage distribution associated with a fourth data value, and
   wherein the second set of instructions includes the second read instruction and a second program instruction, and the second set of instructions corresponds to memory cells in the first set of two or more memory cells having the threshold voltage in one of only two threshold voltage distributions associated with different data values, including the first threshold voltage distribution associated with the first data value and the second threshold voltage distribution associated with the second data value.

8. The memory of claim 5, wherein, corresponding to the second set of instructions, the control circuit stores a same selected data value in all memory cells in the first set of two or more memory cells.

9. The memory of claim 5, wherein the second set of instructions includes a program instruction that stores a same selected data value in all memory cells in the first set of two or more memory cells.

10. The memory of claim 5, wherein, corresponding to the second set of instructions,
the first set of memory cells includes:
    at least one selected memory cell in the first set of memory cells, wherein the control circuit stores a same selected data value in all of said at least one selected memory cell; and
    other memory cells different from said at least one selected memory cell, wherein said other memory cells store the first data value, and the first threshold voltage distribution associated with the first data value is a lower voltage distribution than the second threshold voltage distribution associated with the second data value,
    such that responsive to the control circuit applying the read bias arrangement to the first set of word lines, the same selected data value is read from the first set of memory cells.

11. The memory of claim 5, wherein,
the first set of instructions corresponds to a first version of the second threshold voltage distribution associated with the second data value, the first version of the second threshold voltage distribution having a first version distribution minimum; and
the second set of instructions corresponds to a second version of the second threshold voltage distribution associated with the second data value, the second version of the second threshold voltage distribution having a second version distribution minimum,
wherein the first version distribution minimum is smaller than the second version distribution minimum.

12. The memory of claim 1, comprising:
an instruction register storing one of a first value and a second value,
    wherein the control circuit is responsive to the instruction register storing the first value, the read instruction applies a first read bias arrangement to the first set of two or more word lines to read a selected data value stored on the first set of two or more memory cells by measuring current flowing between the first end and the second end of the series, wherein the first read bias arrangement applied to word lines of the first set of two or more word lines applies both (i) word line voltages less than the second minimum of the second threshold voltage distribution, and (ii) word line voltages greater than the second maximum of the second threshold voltage distribution; and
    wherein the control circuit is responsive to the instruction register storing the second value, the read instruction applies the read bias arrangement to the first set of two or more word lines to read a selected data value stored on the first set of two or more memory cells by measuring current flowing between the first end and the second end of the series, wherein the read bias arrangement applied to word lines of the first set of two or more word lines applies only word line voltages less than the second maximum of the second threshold voltage distribution.

13. The memory of claim 12, wherein the instruction register storing the first value, corresponds to memory cells in the first set of two or more memory cells having the threshold voltage in one of at least four threshold voltage distributions associated with different data values, including at least the first threshold voltage distribution associated with the first data value, the second threshold voltage distribution associated with the second data value, a third threshold voltage distribution associated with a third data value, and a fourth threshold voltage distribution associated with a fourth data value, and
    wherein the instruction register storing the second value, corresponds to memory cells in the first set of two or more memory cells having the threshold voltage in one of only two threshold voltage distributions associated with different data values, including the first threshold voltage distribution associated with the first data value and the second threshold voltage distribution associated with the second data value.

14. The memory of claim 12, wherein, corresponding to the instruction register storing the second value, the control circuit stores a same selected data value in all memory cells in the first set of two or more memory cells.

15. The memory of claim 12, wherein, corresponding to the instruction register storing the second value, the control circuit includes a program instruction that stores a same selected data value in all memory cells in the first set of two or more memory cells.

16. The memory of claim 12, wherein, corresponding to the instruction register storing the second value,
the first set of two or more memory cells includes:
    at least one selected memory cell in the first set of two or more memory cells, wherein the control circuit stores a same selected data value in all of said at least one selected memory cell; and
    other memory cells different from said at least one selected memory cell, wherein said other memory cells store the first data value, and the first threshold voltage distribution associated with the first data value is a lower voltage distribution than the second threshold voltage distribution associated with the second data value,
    such that responsive to the control circuit applying the read bias arrangement to the first set of two or more word lines, the same selected data value is read from the first set of two or more memory cells.

17. The memory of claim 12, wherein,
the instruction register storing the first value corresponds to a first version of the second threshold voltage distribution associated with the second data value, the first version of the second threshold voltage distribution having a first version distribution minimum; and
the instruction register storing the second value corresponds to a second version of the second threshold voltage distribution associated with the second data value, the second version of the second threshold voltage distribution having a second version distribution minimum,
wherein the first version distribution minimum is smaller than the second version distribution minimum.

18. A method of using a plurality of memory cells arranged in series in a semiconductor body, the series having a first end and a second end, the plurality including a first set of two or more memory cells, memory cells in the first set of two or more memory cells having a threshold voltage in one of a first threshold voltage distribution associated with a first data value and a second threshold voltage distribution associated with a second data value, the first threshold voltage distribution being a lower voltage distribution than the second threshold voltage distribution, the first threshold voltage distribution having a first minimum and a first maximum and the second threshold voltage distribution having a second minimum and a second maximum, the plurality including a second set of two or more memory cells having the threshold voltage in a default threshold voltage distribution comprising:

applying a read bias arrangement to a first set of two or more word lines coupled to the first of two or more memory cells to read a selected data value stored on the first set of two or more memory cells by measuring current flowing between the first end and the second end of the series, wherein the read bias arrangement applied to word lines of the first set of two or more word lines applies only word line voltages less than the second maximum of the second threshold voltage distribution.

19. The method of claim 18, further comprising:
prior to applying the read bias arrangement, applying a first program bias arrangement to the first set of two or more word lines, such that a selected memory cell of the first set of two or more memory cells has the threshold voltage in the second threshold voltage distribution.

20. A memory, comprising:
a plurality of memory cells arranged in series in a semiconductor body, the series having a first end and a second end, the plurality of memory cells having a threshold voltage in one of a first threshold voltage distribution associated with a first data value and a second threshold voltage distribution associated with a second data value, the first threshold voltage distribution having a first minimum and a first maximum and the second threshold voltage distribution having a second minimum and a second maximum, the first threshold voltage distribution being a lower voltage distribution than the second threshold voltage distribution, the plurality of memory cells including:
  a first set of two or more memory cells, memory cells in the first set of two or more memory cells programmed to store the threshold voltage in the second threshold voltage distribution, the threshold voltages in the first set of two or more memory cells representing copies of the second data value;
  a second set of two or more memory cells having the threshold voltage in a default threshold voltage distribution;
a plurality of word lines, word lines in the plurality of word lines coupled to corresponding memory cells in the plurality of memory cells; and
a control circuit coupled to the plurality of word lines,
  wherein the control circuit applies a read bias arrangement to the plurality of word lines to read a selected data value stored on the plurality of memory cells by measuring current flowing between the first end and the second end of the series, wherein the read bias arrangement applied to word lines of the plurality of word lines applies only word line voltages less than the second maximum of the second threshold voltage distribution.

* * * * *